US009859528B2

(12) United States Patent
Noda et al.

(10) Patent No.: US 9,859,528 B2
(45) Date of Patent: Jan. 2, 2018

(54) DISPLAY AND ELECTRONIC APPARATUS

(71) Applicant: JOLED INC., Tokyo (JP)

(72) Inventors: Makoto Noda, Kanagawa (JP); Mao Katsuhara, Kanagawa (JP)

(73) Assignee: JOLED INC., Tokyo (JP)

( * ) Notice: Subject to any disclaimer, the term of this patent is extended or adjusted under 35 U.S.C. 154(b) by 104 days.

(21) Appl. No.: 14/362,427

(22) PCT Filed: Nov. 1, 2012

(86) PCT No.: PCT/JP2012/078291
§ 371 (c)(1),
(2) Date: Jun. 3, 2014

(87) PCT Pub. No.: WO2013/084629
PCT Pub. Date: Jun. 13, 2013

(65) Prior Publication Data
US 2014/0346485 A1 Nov. 27, 2014

(30) Foreign Application Priority Data
Dec. 9, 2011 (JP) .................................. 2011-269987

(51) Int. Cl.
H01L 51/52 (2006.01)
H01L 27/32 (2006.01)
H01L 51/50 (2006.01)

(52) U.S. Cl.
CPC .......... *H01L 51/5275* (2013.01); *H01L 27/32* (2013.01); *H01L 27/3246* (2013.01); *H01L 51/5012* (2013.01); *H01L 51/5284* (2013.01)

(58) Field of Classification Search
CPC .. H01L 27/3246; H01L 51/52; H01L 51/5284
See application file for complete search history.

(56) References Cited

U.S. PATENT DOCUMENTS

2003/0146695 A1* 8/2003 Seki .............................. 313/506
2003/0160247 A1* 8/2003 Miyazawa ..................... 257/79
(Continued)

FOREIGN PATENT DOCUMENTS

JP 2003-195775 7/2003
JP 2003-282260 10/2003
(Continued)

OTHER PUBLICATIONS

Written Opinion of the International Search Authority, dated Jun. 9, 2014.*

*Primary Examiner* — Thomas L Dickey
(74) *Attorney, Agent, or Firm* — Dentons US LLP

(57) ABSTRACT

Provided is a display (1) including: an insulating layer (19) having an opening (19M); and a light-emission device (10) including a functional layer (15) and provided in the opening of the insulating layer, the functional layer being provided between a first electrode (14) and a second electrode (16) and including a light emitting layer. The insulating layer includes a low-refractive-index layer, the low-refractive-index layer being made of a material having a lower refractive index than a refractive index of a layer (15A), and the layer (15A) being in proximity to the insulating layer and included in the functional layer.

12 Claims, 15 Drawing Sheets

(56) References Cited

U.S. PATENT DOCUMENTS

| | | | |
|---|---|---|---|
| 2008/0048558 A1* | 2/2008 | Song | H01L 51/5281 313/504 |
| 2010/0200846 A1* | 8/2010 | Kwack | H01L 51/5253 257/40 |
| 2011/0220924 A1* | 9/2011 | Fukuda | 257/91 |
| 2012/0228602 A1* | 9/2012 | Nakatani | H01L 51/5088 257/40 |

FOREIGN PATENT DOCUMENTS

| | | | |
|---|---|---|---|
| JP | 2004-199952 | 7/2004 | |
| JP | 2004-296219 | 10/2004 | |
| JP | 2009-059809 | 3/2009 | |
| JP | 2009-110873 | 5/2009 | |
| WO | WO/2010/092694 A1 | 8/2010 | |
| WO | WO 2011067895 A1 * | 6/2011 | H01L 51/5088 |

* cited by examiner

[ FIG. 1 ]
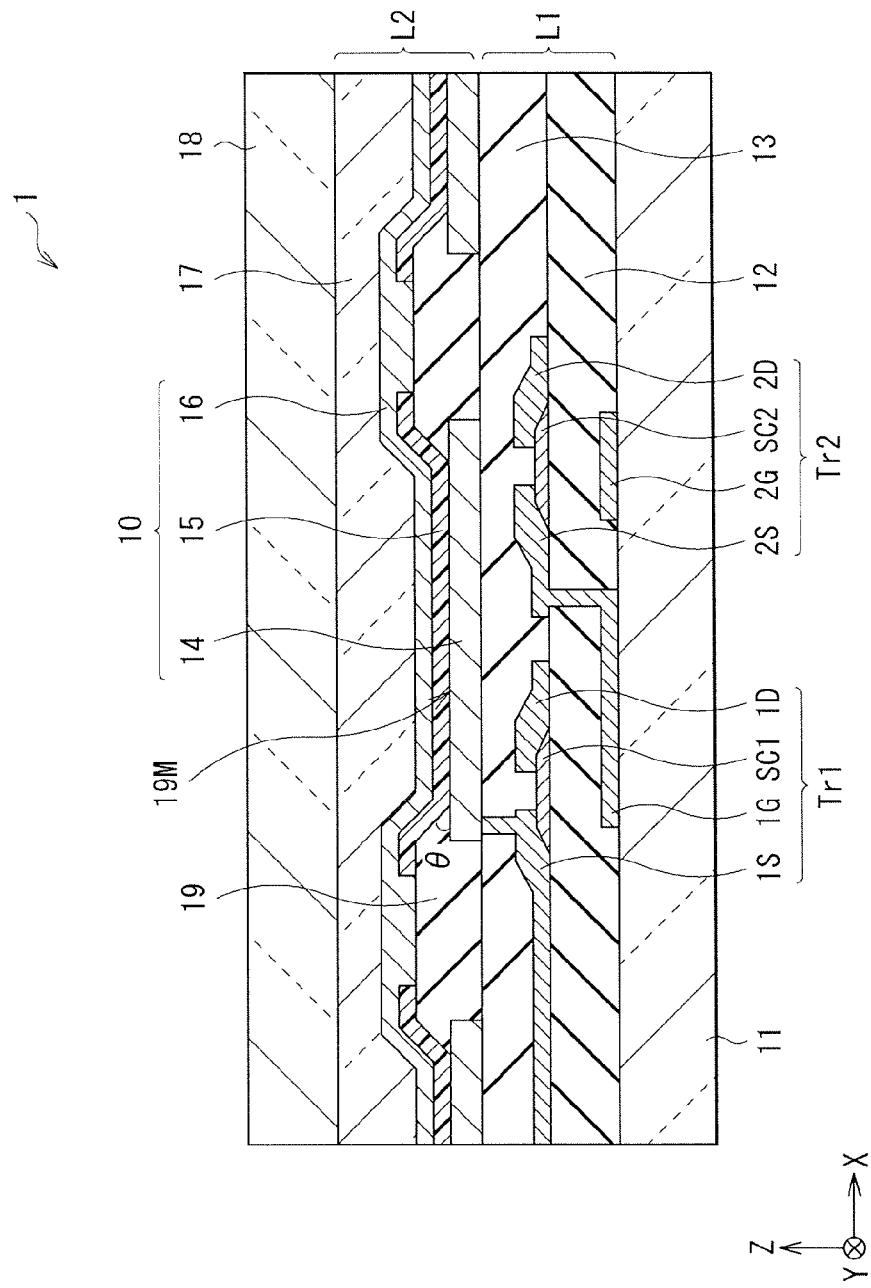

[ FIG. 2 ]
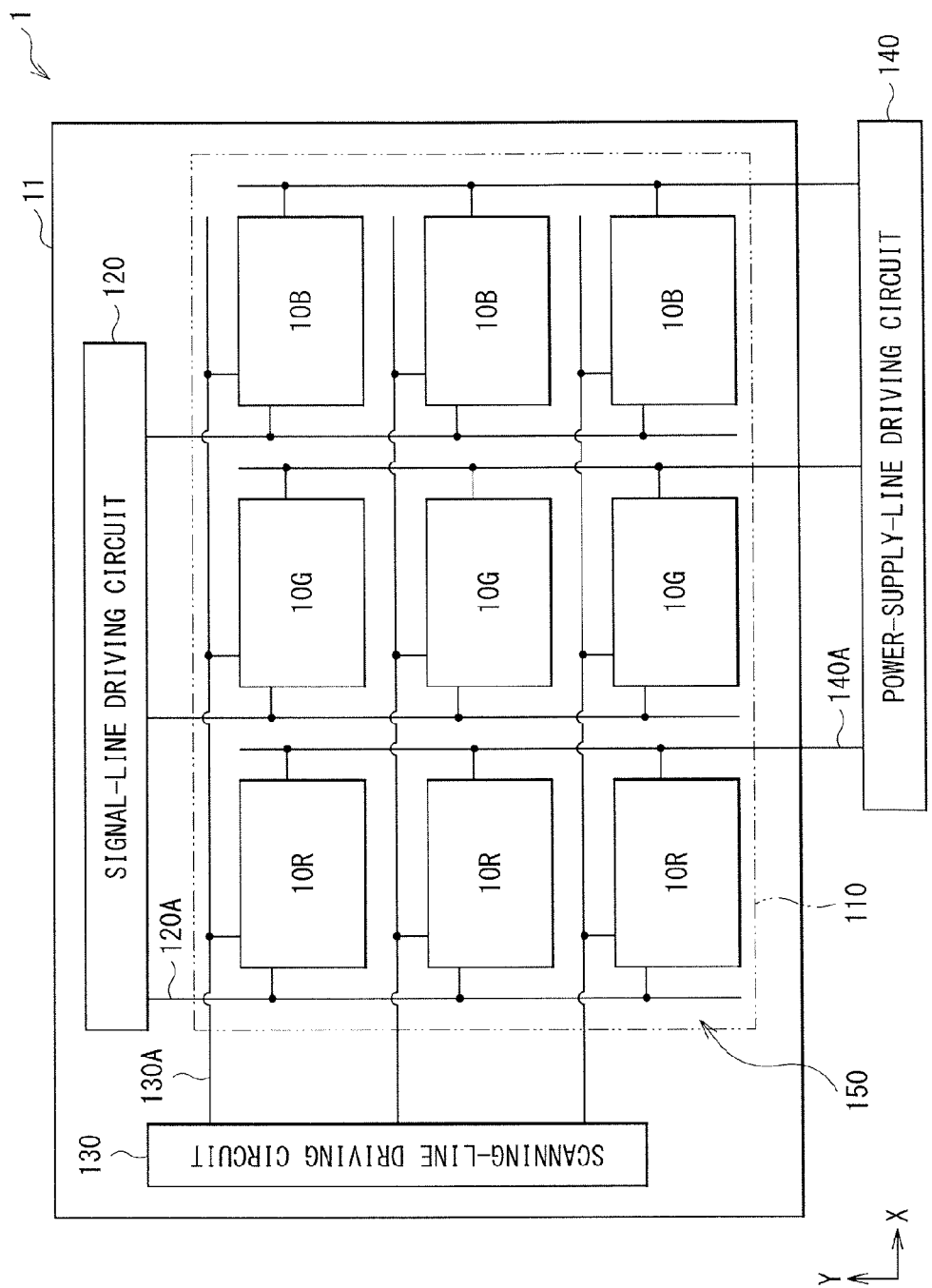

[FIG. 3]
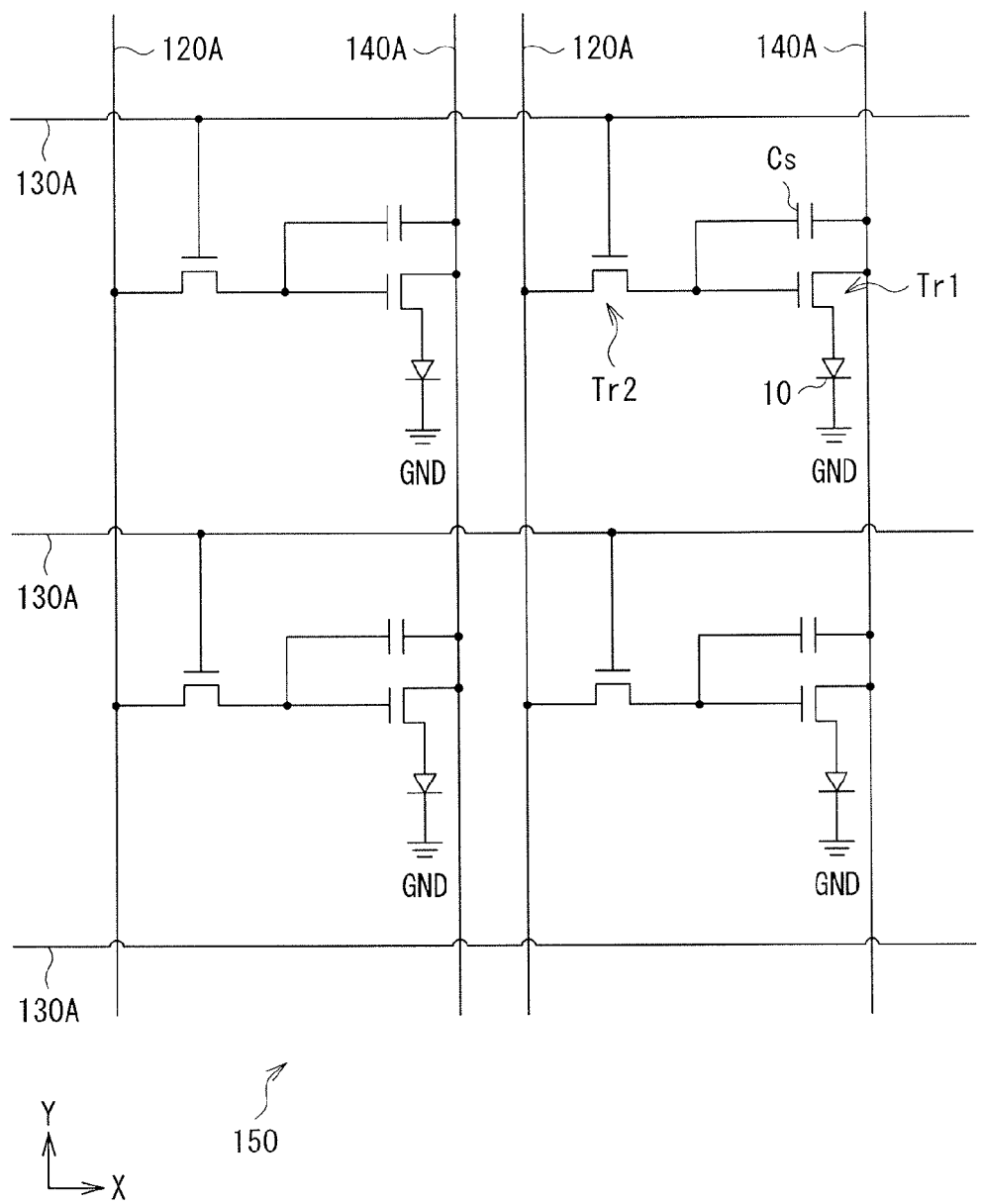

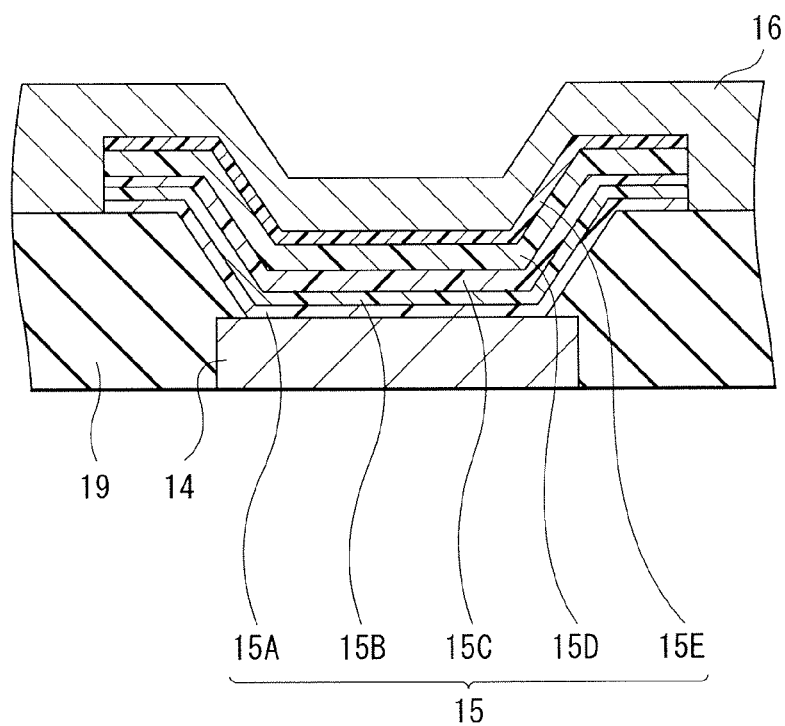
[ FIG. 4 ]

[ FIG. 5A ]
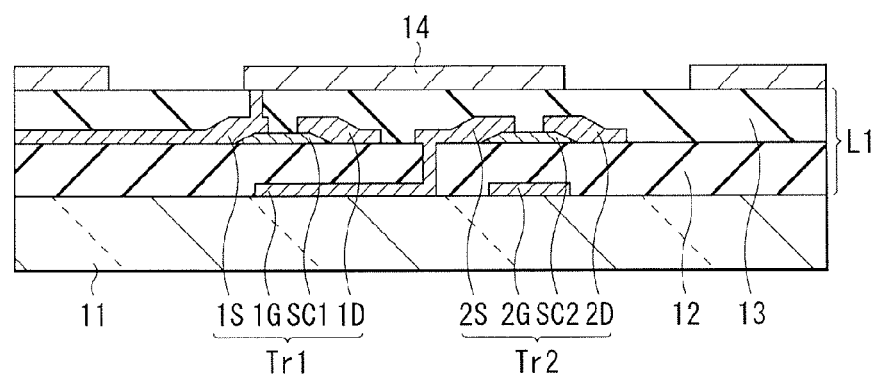
[ FIG. 5B ]
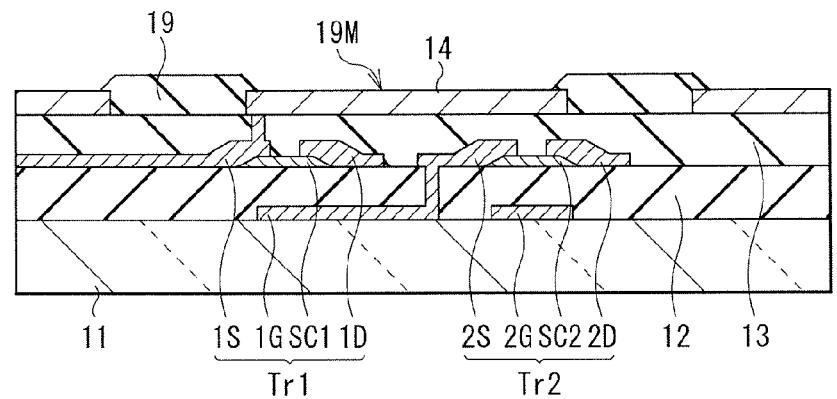

[ FIG. 6 ]
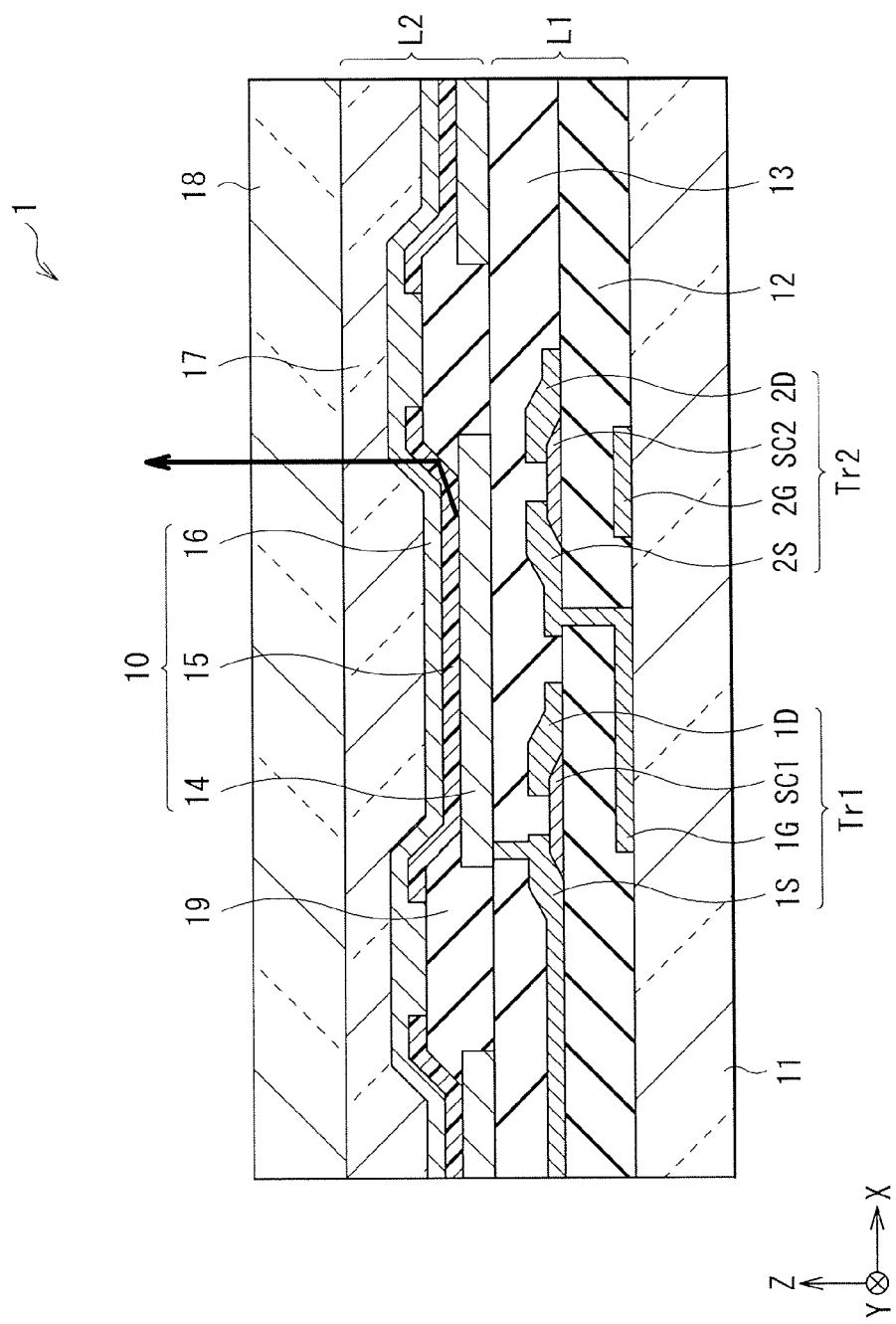

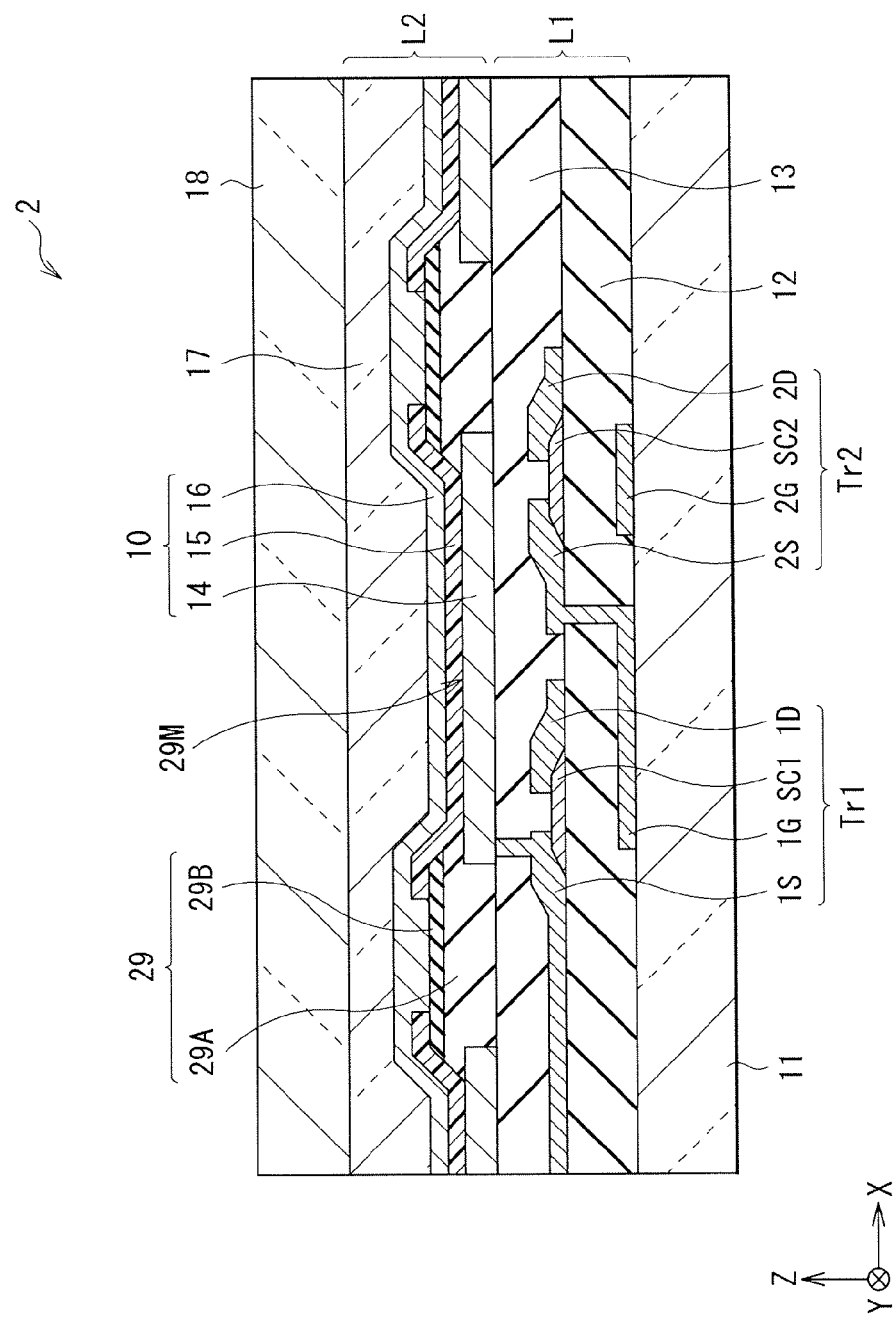
[FIG. 7]

[ FIG. 8A ]
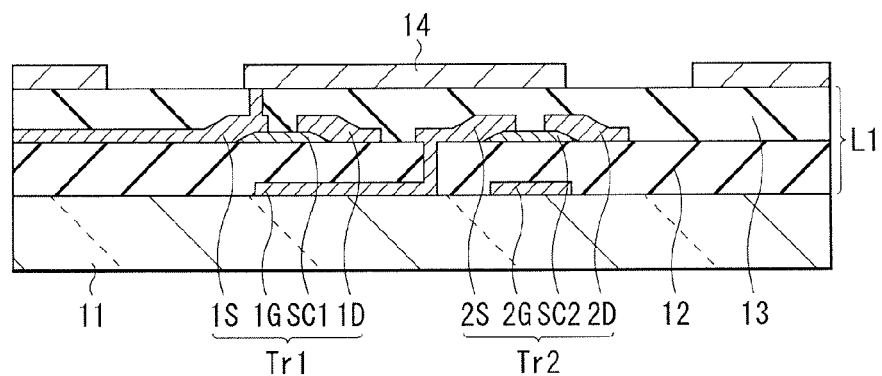
[ FIG. 8B ]
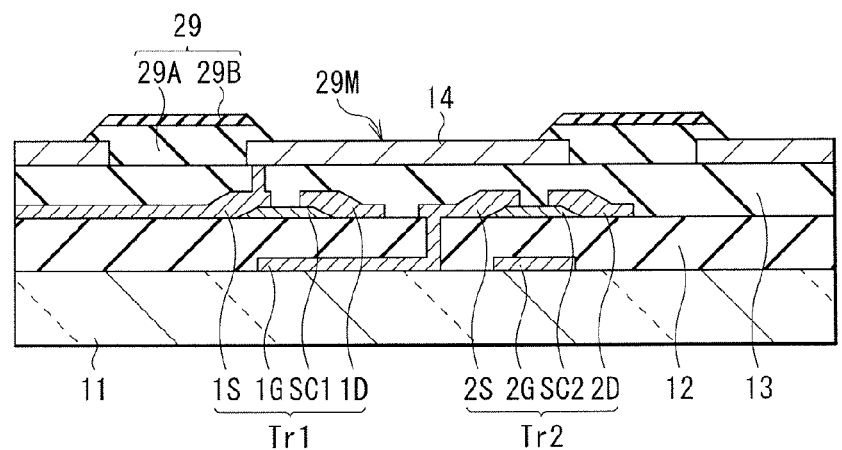

[FIG. 9]
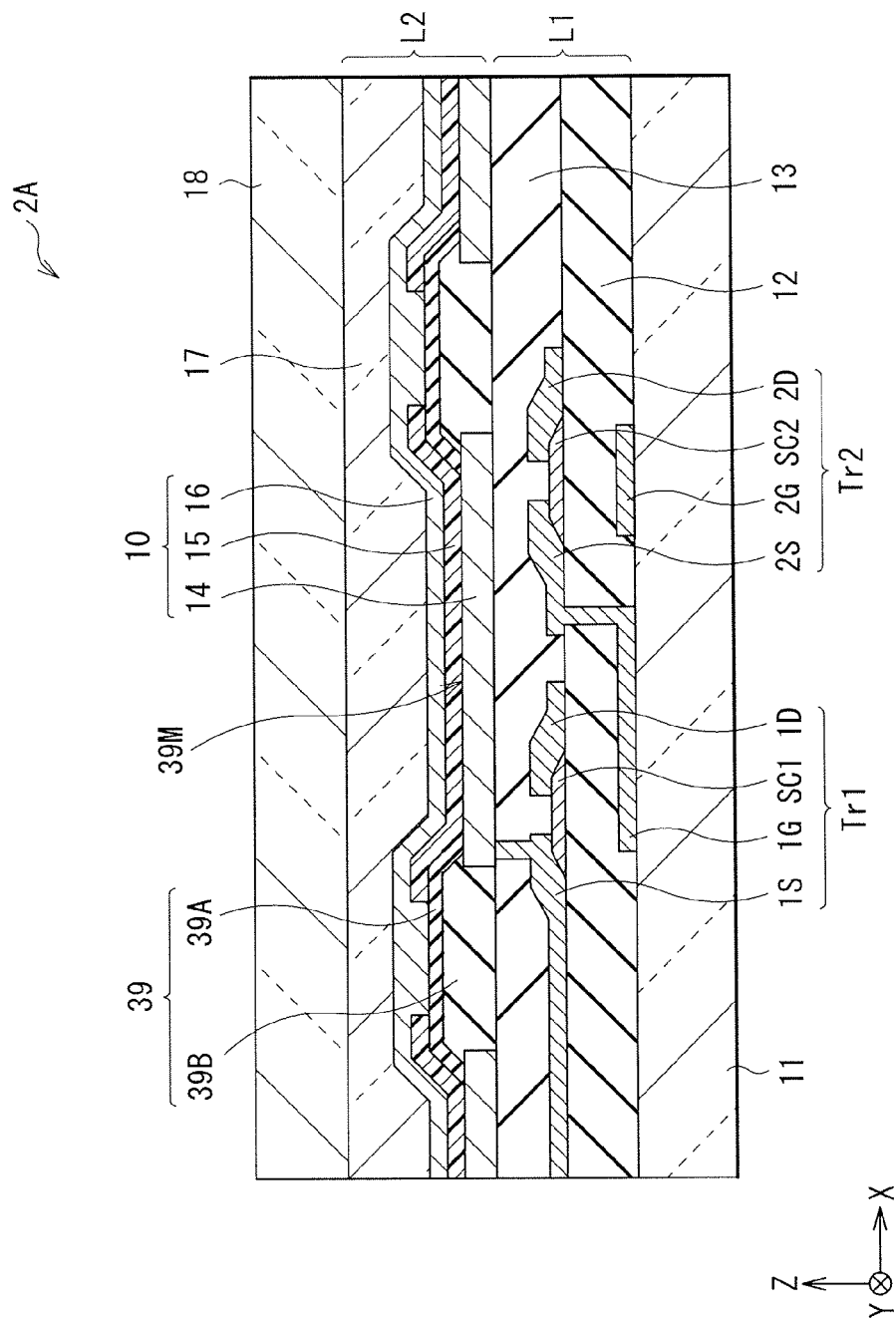

[ FIG. 10A ]
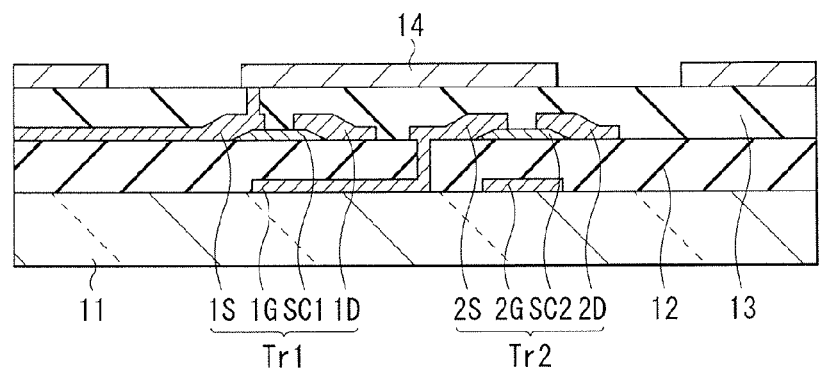
[ FIG. 10B ]
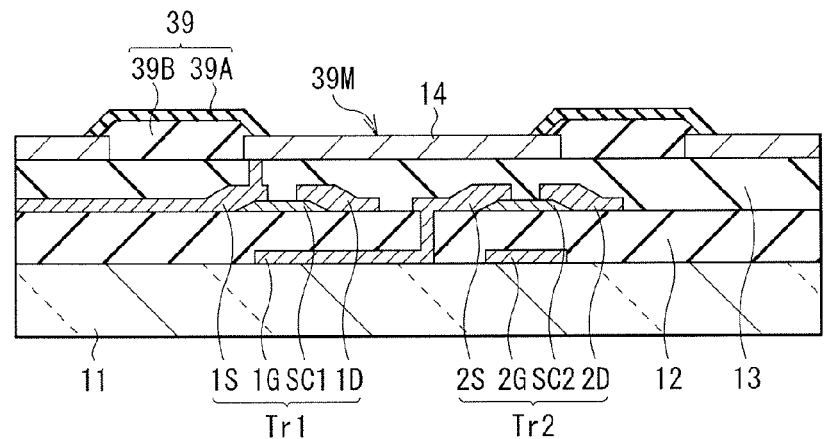

[ FIG. 11 ]
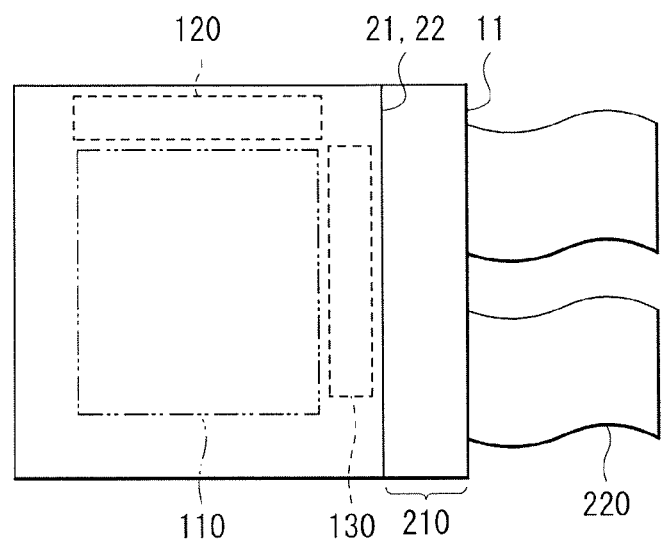
[ FIG. 12 ]
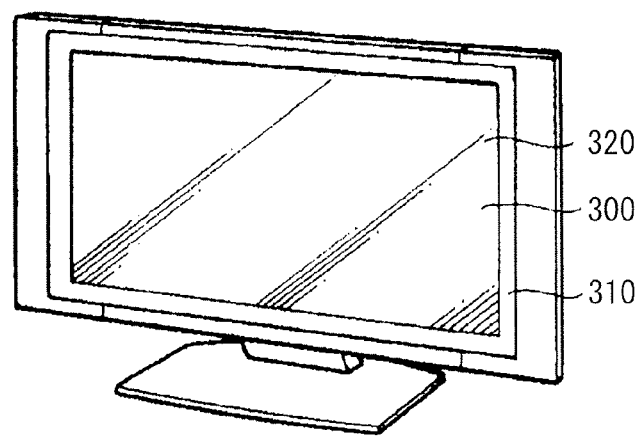

[ FIG. 13A ]
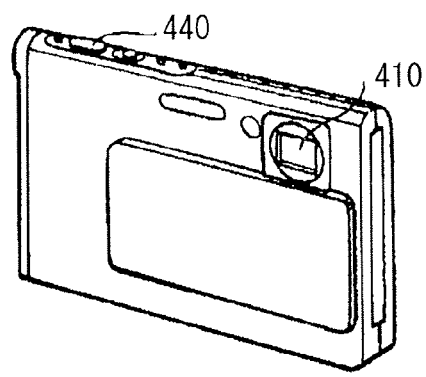
[ FIG. 13B ]
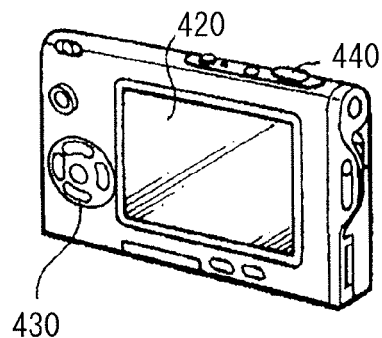

[ FIG. 14 ]
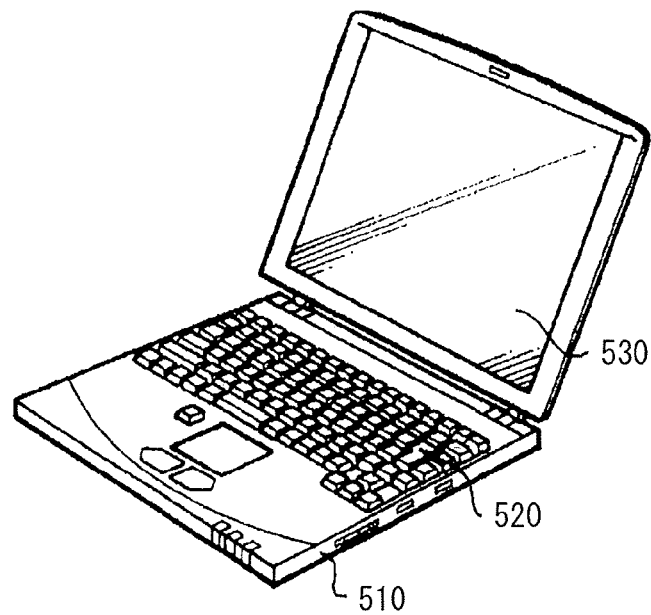
[ FIG. 15 ]
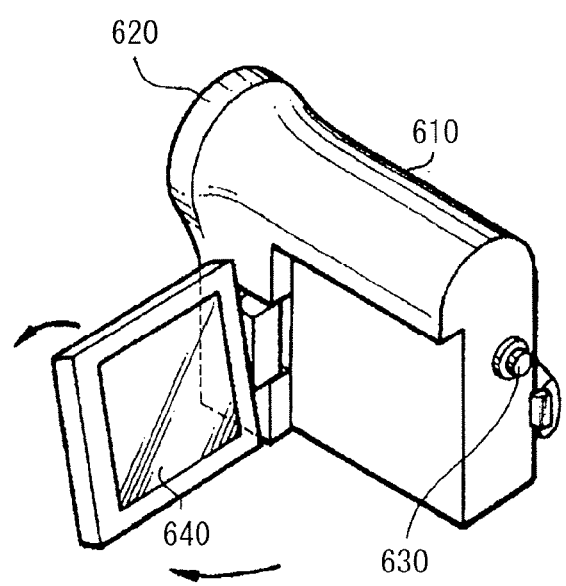

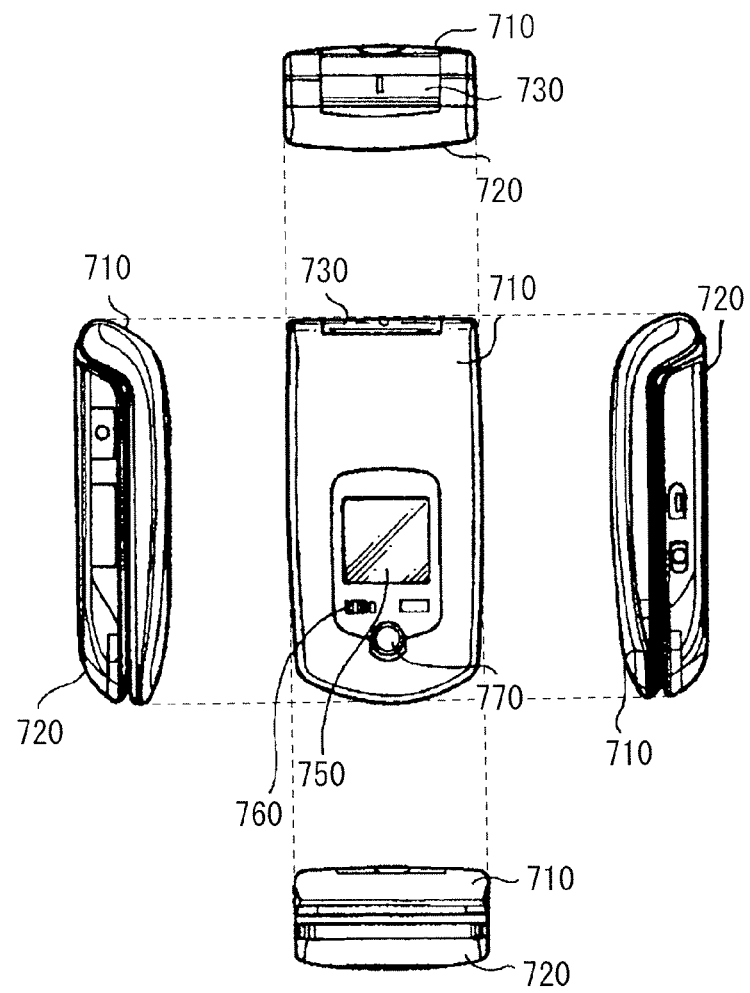

[ FIG. 16B ]
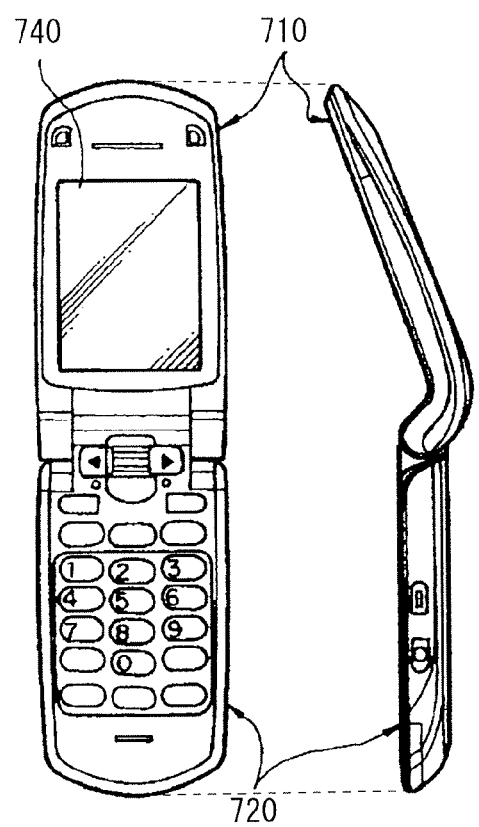

DISPLAY AND ELECTRONIC APPARATUS

TECHNICAL FIELD

The present technology relates to, for example, a display and an electronic apparatus each including a self-luminous device such as an organic EL (ElectroLuminescence) element.

BACKGROUND ART

As development of information and communication industry has advanced, high-performance display devices have been demanded. For example, an organic EL (ElectroLuminescence) element is a self-light-emitting-type display device, which is excellent in terms of viewing angle, contrast, and response speed (for example, Patent Literature 1).

Such a self-light-emitting-type element such as an organic EL device includes a first electrode, a functional layer including a light emitting layer, and a second electrode in this order on a substrate, and elements next to each other are separated from each other by an insulating layer (a pixel separation layer).

CITATION LIST

Patent Literature

Patent Literature 1: Japanese Unexamined Patent Application Publication No. 2009-59809

SUMMARY OF THE INVENTION

For such a self-light-emitting-type display device, it is expected to suppress power consumption, by extracting light emitted from the light emitting layer, to a display surface side, more efficiently.

Accordingly, it is desirable to provide a display having higher light extraction efficiency, and an electronic apparatus including this display.

A display according to an embodiment of the present technology includes: an insulating layer having an opening; and a light-emission device including a functional layer and provided in the opening of the insulating layer, the functional layer being provided between a first electrode and a second electrode and including a light emitting layer. The insulating layer includes a low-refractive-index layer, the low-refractive-index layer being made of a material having a lower refractive index than a refractive index of a layer, and the layer being in proximity to the insulating layer and included in the functional layer. An electronic apparatus according to an embodiment of the present technology includes the above-described display.

In the display and the electronic apparatus of the embodiments of the present technology, the insulating layer includes the low-refractive-index layer. Therefore, light emitted from the light emitting layer is totally reflected by a wall surface of the opening (the insulating layer including the low-refractive-index layer), easily.

According to the display and the electronic apparatus of the embodiments of the present technology, the insulating layer includes the low-refractive-index layer and therefore, of the light emitted from the light emitting layer, a quantity of light reflected by the insulating layer is allowed to be increased. Accordingly, light extraction efficiency is improved, which allows suppression of power consumption.

BRIEF DESCRIPTION OF DRAWINGS

FIG. 1 is a cross-sectional diagram illustrating a configuration of a display according to a first embodiment of the present disclosure.

FIG. 2 is a schematic diagram illustrating an overall configuration of the display illustrated in FIG. 1.

FIG. 3 is a circuit diagram illustrating an example of a pixel driving circuit illustrated in FIG. 2.

FIG. 4 is a cross-sectional diagram illustrating a configuration of an organic layer illustrated in FIG. 1.

FIG. 5A is a cross-sectional diagram illustrating a process in a method of manufacturing the display illustrated in FIG. 1.

FIG. 5B is a cross-sectional diagram illustrating a process following that in FIG. 5A.

FIG. 6 is a diagram used to describe a path of light emitted from the organic layer illustrated in FIG. 1.

FIG. 7 is a cross-sectional diagram illustrating a configuration of a display according to a second embodiment of the present disclosure.

FIG. 8A is a cross-sectional diagram illustrating a process in a method of manufacturing the display illustrated in FIG. 7.

FIG. 8B is a cross-sectional diagram illustrating a process following that in FIG. 8A.

FIG. 9 is a cross-sectional diagram illustrating a configuration of a display according to a modification.

FIG. 10A is a cross-sectional diagram illustrating a process in a method of manufacturing the display illustrated in FIG. 9.

FIG. 10B is a cross-sectional diagram illustrating a process following that in FIG. 10A.

FIG. 11 is a plan view illustrating a schematic configuration of a module including the display of any of the above-described embodiments.

FIG. 12 is a perspective view illustrating an appearance of Application example 1 of the display of any of the above-described embodiments.

FIG. 13A is a perspective view illustrating an appearance of Application example 2 when viewed from front.

FIG. 13B is a perspective view illustrating an appearance of Application example 2 when viewed from back.

FIG. 14 is a perspective view illustrating an appearance of Application example 3.

FIG. 15 is a perspective view illustrating an appearance of Application example 4.

FIG. 16A is a diagram illustrating a closed state of Application example 5.

FIG. 16B is a diagram illustrating an open state of Application example 5.

MODES FOR CARRYING OUT THE INVENTION

Embodiments of the present technology will be described below in detail with reference to the drawings. It is to be noted that the description will be provided in the following order.
1. First embodiment (an example in which an insulating layer is configured using a low-refractive-index layer)
2. Second embodiment (an example in which an insulating layer is configured using a low-refractive-index layer and a black layer)

3. Modification (an example in which an insulating layer is configured using a low-refractive-index layer and a black layer, and a wall surface of an opening of the insulating layer is covered by the low-refractive-index layer)

First Embodiment

[Overall Configuration of Display]

FIG. 1 illustrates a cross-sectional configuration of a main part of a display (a display 1) according to a first embodiment of the present technology. This display 1 is a self-light-emitting type display including a plurality of organic light-emission devices 10. The display 1 includes, on a supporting substrate 11 (a first substrate), a pixel-driving-circuit formed layer L1, a light-emission-device formed layer L2 including the organic light-emission devices 10, and a counter substrate 18 (a second substrate) in this order. The display 1 is a so-called top-emission-type display having a light extraction direction to the counter substrate 18 side, and the pixel-driving-circuit formed layer L1 may include, for example, a signal-line driving circuit and a scanning-line driving circuit (not illustrated) for image display. Details of each component will be described later.

FIG. 2 illustrates an overall configuration of the display 1. The display 1 is used as an ultrathin organic light-emitting color display having a display region 110 on the supporting substrate 11. Around the display region 110 in the supporting substrate 11, for example, a signal-line driving circuit 120, a scanning-line driving circuit 130, and a power-supply-line driving circuit 140 that are drivers for image display may be provided.

In the display region 110, the plurality of organic light-emission devices 10 (10R, 10G, and 10B) arranged two-dimensionally in a matrix, and a pixel driving circuit 150 used to drive these devices are formed. The organic light-emission devices 10R, 10G, and 10B refer to the organic light-emission devices 10 emitting red light, green light, and blue light, respectively. In the pixel driving circuit 150, a plurality of signal lines 120A (120A1, 120A2, . . . , 120Am, . . . ) as well as a plurality of power supply lines 140A (140A1, . . . , 140An, . . . ) are arranged in a column direction (a Y direction), and a plurality of scanning lines 130A (130A1, . . . , 130An, . . . ) are arranged in a row direction (an X direction). At an intersection of each of the signal lines 120A and each of the scanning lines 130A, any one of the organic light-emission devices 10R, 10G, and 10B is provided to correspond thereto. Both ends of each of the signal lines 120A are connected to the signal-line driving circuit 120, both ends of each of the scanning lines 130A are connected to the scanning-line driving circuit 130, and both ends of each of the power supply lines 140A are connected to the power-supply-line driving circuit 140.

The signal-line driving circuit 120 supplies a signal voltage of an image signal corresponding to luminance information supplied from a signal supply source (not illustrated), to each of the organic light-emission devices 10R, 10G, and 10B selected through the signal line 120A. The signal voltage from the signal-line driving circuit 120 is applied to the signal line 120A through the both ends thereof.

The scanning-line driving circuit 130 is configured using a shift register that sequentially shifts (transfers) a start pulse in synchronization with an inputted clock pulse, and the like. In writing of the image signal to each of the organic light-emission devices 10R, 10G, and 10B, the scanning-line driving circuit 130 scans these devices row by row, and sequentially supplies a scanning signal to each of the scanning lines 130A. The scanning signal from the scanning-line driving circuit 130 is supplied to the scanning line 130A through the both ends thereof.

The power-supply-line driving circuit 140 is configured using a shift register that sequentially shifts (transfers) a start pulse in synchronization with an inputted clock pulse, and the like. The power-supply-line driving circuit 140 appropriately supplies either one a first electric potential and a second electric potential that are different from each other, to each of the power supply lines 140A through the both ends thereof, in synchronization with column-by-column scanning by the signal-line driving circuit 120. As a result, a conducting state or a non-conducting state of a drive transistor Tr1 to be described later is selected.

The pixel driving circuit 150 is provided in a layer between the substrate 11 and the organic light-emission device 10, i.e., in the pixel-driving-circuit formed layer L1. FIG. 3 illustrates a configuration example of the pixel driving circuit 150. The pixel driving circuit 150 is an active drive circuit including the drive transistor Tr1 as well as a write transistor Tr2, a capacitor (a retention capacitor) Cs therebetween, and the organic light-emission device 10. The organic light-emission device 10 is connected to the drive transistor Tr1 in series, between the power supply line 140A and a common power supply line (GND). The drive transistor Tr1 and the write transistor Tr2 are each configured using a typical thin film transistor (TFT), and may be configured to have, for example, an inverted staggered structure (a so-called bottom-gate type) or a staggered structure (a top-gate type) without being limited in particular.

The write transistor Tr2 may have, for example, a drain electrode connected to the signal line 120A, and be supplied with the image signal from the signal-line driving circuit 120. Further, the write transistor Tr2 has a gate electrode 2G connected to the scanning line 130A, and is supplied with the scanning signal from the scanning-line driving circuit 130. Furthermore, the write transistor Tr2 has a source electrode 2S connected to a gate electrode 1G of the drive transistor Tr1.

The drive transistor Tr1 may have, for example, a drain electrode 1D connected to the power supply line 140A, and be set to either the first electric potential or the second electric potential by the power-supply-line driving circuit 140. A source electrode 1S of the drive transistor Tr1 is connected to the organic light-emission device 10.

The retention capacitor Cs is formed between the gate electrode 1G of the drive transistor Tr1 (the source electrode 2S of the write transistor Tr2) and the drain electrode 1D of the drive transistor Tr1.

[Main Part Configuration of Display]

Next, detailed configurations of the supporting substrate 11, the pixel-driving-circuit formed layer L1, the light-emission-device formed layer L2, the counter substrate 18, and the like will be described with reference to FIG. 1 again. The organic light-emission devices 10R, 10G, and 10B have a common configuration except that respective organic layers 15 (to be described later) have partially different configurations, and therefore will be described below collectively.

The supporting substrate 11 may be formed of, for example, glass, a plastic material, or the like capable of blocking transmission of moisture (water vapor) and oxygen. In the top emission type, light is extracted from the counter substrate 18 and therefore, the supporting substrate 11 may be formed of either a transparent material or a non-transparent material. When the display 1 is a flexible display, the supporting substrate 11 may be preferably configured using a flexible material, for example, a plastic material.

The pixel-driving-circuit formed layer L1 has a laminated structure including a gate insulating film 12 and a flattening layer 13. In the pixel-driving-circuit formed layer L1, the drive transistor Tr1 and the write transistor Tr2 included in the pixel driving circuit 150 are formed, and further, the signal line 120A, the scanning line 130A, and the power supply line 140A (not illustrated) are embedded. Specifically, on the supporting substrate 11, the gate electrodes 1G and 2G of the drive transistor Tr1 and the write transistor Tr2, respectively, are formed, and collectively covered by the gate insulating film 12. On the gate insulating film 12, semiconductor layers SC1 and SC2, the source electrodes 1S and 2S, and the drain electrodes 1D and 2D, in the drive transistor Tr1 and the write transistor Tr2, respectively, are formed.

The gate electrodes 1G and 2G may each be formed of, for example, any one kind or two or more kinds of metallic materials, inorganic conductive materials, organic conductive materials, and carbon materials. Examples of the metallic materials may include aluminum (Al), copper (Cu), molybdenum (Mo), titanium (Ti), chromium (Cr), nickel (Ni), palladium (Pd), gold (Au), silver (Ag), platinum (Pt), and alloys including these elements. Examples of the inorganic conductive materials may include indium oxide ($In_2O_3$), indium tin oxide (ITO), indium zinc oxide (IZO), and zinc oxide (ZnO). Examples of the organic conductive materials may include polyethylenedioxythiophene (PEDOT) and polystyrene sulfonate (PSS). Examples of the carbon materials may include black lead. It is to be noted that the gate electrodes 1G and 2G may each be an electrode in which two or more layers of the above-described various kinds of materials are laminated.

The gate insulating film 12 may be formed of, for example, any one kind or two or more kinds of inorganic insulating materials and organic insulating materials. Examples of the inorganic materials may include silicon oxide ($SiO_x$), silicon nitride ($SiN_x$), aluminum oxide ($Al_2O_3$), titanium oxide ($TiO_2$), hafnium oxide ($HfO_x$), and barium titanate ($BaTiO_3$). Examples of the organic insulating materials may include polyvinyl phenol (PVP), polyimide, polymethacrylic acid acrylate, photosensitive polyimide, photosensitive novolac resin, and polyparaxylylene. It is to be noted that the gate insulating film 12 may be a film in which two or more layers of the above-described various kinds of materials are laminated.

The semiconductor layers SC1 and SC2 are formed of any one kind or two or more kinds of inorganic insulating materials and organic insulating materials. Examples of the inorganic semiconductor materials may include amorphous silicon. Further, usable examples of the organic semiconductor materials may include acenes and derivatives thereof. Examples of the acenes may include naphthacene, pentacene, hexacene, heptacene, dibenzopentacene, tetrabenzopentacene, pyrene, dibenzopyrene, chrysene, perylene, coronene, terylene, ovalene, quaterrylene, and circumanthracene. When the display 1 is a flexible display, the semiconductor layers SC1 and SC2 may be preferably configured using an organic semiconductor material.

The source electrodes 1S and 2S as well as the drain electrodes 1D and 2D may be formed of, for example, a material similar to the above-described material of the gate electrodes 1G and 2G, and may be preferably in ohmic contact with the semiconductor layers SC1 and SC2.

The flattening layer 13 is provided to flatten mainly a surface of the pixel-driving-circuit formed layer L1, and may be formed of, for example, an insulating resin material such as polyimide. The source electrode and the drain electrode may be covered by a passivation layer made of a fluorination polymer or the like, and the flattening layer 13 may be provided on this passivation layer.

In the light-emission-device formed layer L2, the organic light-emission device 10, an insulating layer 19, and a sealing layer 17 used to cover them are provided.

The organic light-emission device 10 is a device in which a first electrode 14 serving as an anode electrode, the organic layer 15 (a functional layer) including a light emitting layer 15C (to be described later), and a second electrode 16 serving as a cathode electrode are laminated in order from the supporting substrate 11 side. The organic layer 15 and the first electrode 14 are isolated by the insulating layer 19 for each of the organic light-emission devices 10. On the other hand, the second electrode 16 is provided to be common to all the organic light-emission devices 10.

The first electrode 14 is an electrode that injects a positive hole into the organic layer 15 (specifically, a hole injection layer 15A to be described later), and is provided on the flattening layer 13 for each of the organic light-emission devices 10R, 10G, and 10B. The first electrode 14 has a reflecting surface on a surface facing the organic layer 15, and reflects light emitted from the light emitting layer 15C towards the display surface side (the second electrode 16 side). Therefore, reflectance of the first electrode 14 may be preferably as high as possible, to increase luminous efficiency. The first electrode 14 may be made of, for example, a simple substance or an alloy of a metallic element such as silver (Ag), aluminum (Al), molybdenum (Mo), and chromium (Cr). Alternatively, the first electrode 14 may have a laminated structure including the above-described metal film and a transparent conductive film. Examples of the transparent conductive film may include indium tin oxide (ITO), indium zinc oxide (InZnO), as well as alloys of zinc oxide (ZnO) and aluminum (Al).

The organic layer 15 is made of an organic material, and has a configuration in which a hole injection layer 15A, a hole transport layer 15B, the light emitting layer 15C, an electron transport layer 15D, and an electron injection layer 15E are laminated in order from the first electrode 14 side as illustrated in FIG. 4. However, the layers except the light emitting layer may be provided as necessary.

The hole injection layer 15A is a buffer layer provided to increase hole injection efficiency, and to prevent leakage. The hole transport layer 15B is provided to increase hole transport efficiency for the light emitting layer 15C. In the light emitting layer 15C, light is generated by electron-hole recombination caused by application of an electric field. The electron transport layer 15D is provided to increase electron transport efficiency for the light emitting layer 15C, and the electron injection layer 15E is provided to increase electron injection efficiency. The electron injection layer 15E may be made of, for example, LiF or $Li_2O$.

The materials of the respective layers of the organic layer 15 are partially different depending on a light emission color of each of the organic light-emission devices 10R, 10G, and 10B. The hole injection layer 15A of the organic light-emission device 10R may be configured using, for example, 4,4',4"-tris(3-methylphenylphenylamino)triphenylamine (m-MTDATA), 4,4',4"-tris(2-naphthylphenylamino)triphenylamine (2-TNATA), bis[(N-naphthyl)-N-phenyl]benzidine (α-NPD), poly(3-hexylthiophene) (P3HT), or poly(3,4-ethylenedioxythiophene):poly(styrenesulfonate)

(PEDOT-PSS). The hole transport layer 15B of the organic light-emission device 10R may be configured using, for example, α-NPD. The light emitting layer 15C of the organic light-emission device 10R may be configured using, for example, a 8-quinolinol aluminum complex ($Alq_3$) mixed with 40 vol % of 2,6-bis[4-[N-(4-methoxyphenyl)-N-phenyl]aminostyryl]naphthalene-1,5-dicarbonitrile (BSN-BCN). The electron transport layer 15D of the organic light-emission device 10R may be configured using, for example, $Alq_3$.

The hole injection layer 15A of the organic light-emission device 10G may be configured using, for example, m-MTDATA, 2-TNATA, α-NPD, P3HT, or PEDOT-PSS. The hole transport layer 15B of the organic light-emission device 10G may be configured using, for example, α-NPD. The light emitting layer 15C of the organic light-emission device 10G may be configured using, for example, $Alq_3$ mixed with 3 vol % of Coumarin6. The electron transport layer 15D of the organic light-emission device 10G may be configured using, for example, $Alq_3$.

The hole injection layer 15A of the organic light-emission device 10B may be configured using, for example, m-MTDATA, 2-TNATA, α-NPD, P3HT, or PEDOT-PSS. The hole transport layer 15B of the organic light-emission device 10B may be configured using, for example, α-NPD. The light emitting layer 15C of the organic light-emission device 10B may be configured using, for example, spiro6Φ. The electron transport layer 15D of the organic light-emission device 10B may be configured using, for example, $Alq_3$.

On the organic layer 15, the second electrode 16 is provided in a state of being insulated from the first electrode 14, to be common to each of the organic EL devices 10R, 10G, and 10B. The second electrode 16 is made of a transparent material having optical transparency, and may be configured using, for example, indium tin oxide (ITO), zinc oxide (ZnO), aluminum-doped zinc oxide (AZO), gallium-dope zinc oxide (GZO), indium zinc oxide (IZO), indium titanium oxide (ITiO), or indium tungsten oxide (IWO).

The insulating layer 19 has an opening 19M, and in this opening 19M, a laminated structure in which the first electrode 14, the organic layer 15, and the second electrode 16 are in contact with each other is formed. In other words, the organic light-emission device 10 (the organic light-emission devices 10R, 10G, and 10B) is provided in the opening 19M, and a light emission region thereof is defined by the opening 19M. A part of the insulating layer 19 is in contact with a surface of the first electrode 14, and a wall surface (a side face) of the opening 19M is inclined (at an inclination θ) with respect to the surface of the first electrode 14. The inclination θ is arbitrary, and may be any of an acute angle, a right angle, and an obtuse angle, but in the display 1 in which the light extraction direction is pointed to the second electrode 16 side, the inclination θ may be preferably an acute angle. This is because, if the inclination θ is an acute angle, the opening 19M expands towards the second electrode 16 side, so that light extraction efficiency improves. The organic layer 15 is provided along the wall surface and a bottom surface of this opening 19M of the insulating layer 19, and a lowermost layer (the hole injection layer 15A) of the organic layer 15 is in contact with the wall surface of the opening 19M. A planar shape of the opening 19M may be, for example, rectangle, but the shape of the opening 19M is arbitrary, and may be, for example, a slit, a letter U, or the like.

In the present embodiment, this insulating layer 19 is configured using a low-refractive-index layer, the low-refractive-index layer being made of a material having a refractive index lower than that of the material of a layer, which is closest to the insulating layer 19, of the organic layer 15, namely, the hole injection layer 15A. Only at least a part of the insulating layer 19 may be configured using the low-refractive-index layer, and the low-refractive-index layer and the hole injection layer 15A may be preferably in contact with each other. Here, the insulating layer 19 is configured using only the low-refractive-index layer. When the refractive index of the material of the insulating layer 19 is n1 and the refractive index of the material of the hole injection layer 15A is n2, n1<n2 is established. Therefore, light generated in the light emitting layer 15C is totally reflected by the wall surface (a contact surface or an interface between the insulating layer 19 and the hole injection layer 15A) of the opening 19M, and readily emitted towards the counter substrate 18 side, so that the light extraction efficiency improves.

In the insulating layer 19, the refractive index n1 of the material and the inclination θ may be preferably adjusted so that much of the light generated in the light emitting layer 15C is totally reflected by the wall surface of the opening 19M. For example, when the hole injection layer 15A is made of NPD (a $MoO_3$ co-deposited film (doped 20%)), P3HT, or PEDOT/PSS, the insulating layer 19 may be configured using fluorinated polyimide. A refractive index of α-NPD is 1.8, and a refractive index of P3HT is 1.95. At this time, preferably, the insulating layer 19 made of polyimide may be adjusted to have a refractive index of 1.5, by controlling the refractive index through fluorination.

The sealing layer 17 may be formed of, for example, an insulating resin material such as polyimide, like the flattening layer 13.

The counter substrate 18 seals the organic light-emission device 10, together with the sealing layer 17, a bonding layer (not illustrated) such as thermosetting resin, and the like, and is configured using a transparent glass or plastic material allowing the light generated in the light emitting layer 15C included in the organic layer 15 to pass therethrough. The counter substrate 18 may be preferably configured using, for example, a flexible material such as a plastic material. This is because such a counter substrate 18 is less breakable than a case using glass or the like, and therefore is allowed to increase resistance to shock. In addition, a barrier film having a barrier property against oxygen and water may be provided in the counter substrate 18 made of a flexible material and therefore, it is possible to improve reliability of the display 1.

[Method of Manufacturing Display]

This display 1 may be manufactured as follows, for example.

First, as illustrated in FIG. 5A, the pixel-driving-circuit formed layer L1 and the first electrode 14 are formed on the supporting substrate 11. Specifically, at first, a metal film made of the material of the gate electrodes 1G and 2G may be formed on the supporting substrate 11 by vapor deposition, for example. Subsequently, the gate electrodes 1G and 2G as well as the signal line 120A may be formed on the supporting substrate 11, by patterning the metal film through a photolithographic method, dry etching, or wet etching, for example. Next, the gate insulating film 12 is formed using the above-described material by spin coating or the like, to cover the entire surface of the supporting substrate 11. Subsequently, on the gate insulating film 12, the semiconductor layers SC1 and SC2, the drain electrodes 1D and 2D, as well as the source electrodes 1S and 2S may be sequentially formed to have a predetermined shape, by using vapor deposition and a photolithographic method, for example. At that time, a connection section for connection between the gate electrode 1G and the source electrode 2S is formed in the gate insulating film 12 beforehand. Further, when the drain electrodes 1D and 2D as well as the source electrodes 1S and 2S are formed, the scanning line 130A and the power supply line 140A are each also formed. At that time, a necessary connection section for connection between each wiring and each electrode is formed as appropriate. Afterwards, the pixel-driving-circuit formed layer L1 is completed by covering the whole with the flattening layer 13 by spin coating or the like (by further performing photolithography processing as necessary). At that time, a connection hole intended to form a connection section for connection with the first electrode 14 is formed by dry etching or the like, at a predetermined position on a metal layer 1S in the flattening layer 13.

After the pixel-driving-circuit formed layer L1 is formed, the first electrode 14 made of the above-described predetermined material is formed. Specifically, after a metal film made of the above-described material is formed on the entire surface by, for example, vapor deposition, a resist pattern (not illustrated) having a predetermined shape is formed on the metal film by using a predetermined mask. Further, using the resist pattern as a mask, selective etching of the metal film is performed. At that time, the first electrode 14 is formed to cover the surface of the flattening layer 13 and to fill the above-described connection hole.

After the first electrode 14 is formed, the insulating layer 19 is formed by being patterned as illustrated in FIG. 5B. Specifically, the above-described material of the insulating layer 19 is applied to the entire surface of the substrate 11 (on the flattening layer 13 and the first electrode 14) by spin coating. Afterwards, firing, selective exposure, and development are sequentially performed to pattern the material into a predetermined shape having the opening 19M.

Subsequently, the organic layer 15 may be formed to cover the opening 19M completely, by sequentially laminating the hole injection layer 15A, the hole transport layer 15B, the light emitting layer 15C, the electron transport layer 15D, and the electron injection layer 15E each made of the above-described material and having a predetermined thickness, by vapor deposition, for example. Further, the second electrode 16 may be formed over the entire surface by using, for example, vapor deposition, to face the first electrode 14, with the organic layer 15 interposed therebetween. The organic light-emission device 10 is thus formed. The organic layer 15 and the second electrode 16 may be preferably formed using a method excellent in controlling a film thickness, for example, vapor deposition. By precisely controlling the film thickness of each of the organic layer 15 and the second electrode 16, it is possible to utilize multiple interaction of the organic light-emission device 10 between the first electrode 14 and the second electrode 16. Therefore, color gamut of the organic light-emission device 10 is expanded, so that it is possible to omit a color filter.

After the organic light-emission device 10 is formed, the sealing layer 17 is formed on the entire surface of the substrate 11. Finally, the counter substrate 18 may be adhered onto the sealing layer 17 with a bonding layer therebetween by, for example, vacuum lamination, which completes the display 1.

[Operation of Display]

In this display 1, the scanning signal is supplied from the scanning-line driving circuit 130 to each of the organic light-emission devices 10 through the gate electrode 2G of the write transistor Tr2, and the image signal from the signal-line driving circuit 120 is retained at the retention capacitor Cs through the write transistor Tr2. In other words, the drive transistor Tr1 is controlled to be ON/OFF according to this signal retained at the retention capacitor Cs, so that a driving current is injected into the organic light-emission device 10, which causes electron-hole recombination to emit light. This light is extracted after passing through the second electrode 16, the sealing layer 17, and the counter substrate 18.

[Functions and Effects of Display]

Here, the refractive index n1 of the material of the insulating layer 19 is made smaller than the refractive index n2 of the material of the hole injection layer 15A (n1<n2). Therefore, as illustrated in FIG. 6, the light generated in the light emitting layer 15C is totally reflected by the wall surface of the opening 19M of the insulating layer 19 easily. In other words, of the light emitted from the light emitting layer 15C, a quantity of light passing through the insulating layer 19 in an X-axis direction decreases, and a quantity of light emitted to the counter substrate 18 side (a Z-axis direction) increases. Therefore, it is possible to improve the light extraction efficiency.

As described above, in the present embodiment, the refractive index n1 of the insulating layer 19 is made smaller than the refractive index n2 of the hole injection layer 15A and therefore, the light extraction efficiency is improved, which allows suppression of power consumption.

Another embodiment and a modification of the present embodiment will be described below. The same components as those of the above-described embodiment will be provided with the same reference numerals as those thereof and the description thereof will be omitted as appropriate.

Second Embodiment

FIG. 7 illustrates a cross-sectional configuration of a main part of a display (a display 2) according to a second embodiment of the present technology. In this display 2, an insulating layer 29 has a laminated structure including a low-refractive-index layer 29A and a black layer 29B. Except this point, the display 2 has a configuration similar to that of the display 1 of the above-described first embodiment, and functions as well as effects thereof are similar as well.

The insulating layer 29 includes the low-refractive-index layer 29A and the black layer 29B in this order from the first electrode 14 side. This insulating layer 29 is provided with an opening 29M, in a manner similar to that of the insulating layer 19 of the display 1. The low-refractive-index layer 29A is made of the same material (the refractive index n1) as that of the insulating layer 19. The black layer 29B may be configured using, for example, a material that exhibits black color by dispersion of black pigment, dye, and coloring matter in an insulating resin material such as polyimide, namely, a material that reduces reflection by absorbing visible light. Therefore, outside light incident from the counter substrate 18 side is absorbed by the black layer 29B, so that reflection of this outside light by the first electrode 14, i.e., outside-light reflection, is allowed to be suppressed. Hence, light extraction efficiency is allowed to be increased by the low-refractive-index layer 29A, and at the same time, visibility of a display image of the display 2 is allowed to be improved by the black layer 29B. Moreover, it is also possible to reduce the outside-light reflection in the organic light-emission device 10 further, by a combination with a phase difference plate and/or a polarizing plate (not illustrated).

Further, pixel separation is achieved by the insulating layer 29 including the black layer 29B and therefore, it is also possible to avoid mixture of image lights of different colors emitted from the organic light-emission device 10R, 10G, and 10B next to each other (color mixture).

In addition, it is not necessary to perform special alignment work, when laminating the counter substrate 18 on the pixel-driving-circuit formed layer L1 and the light-emission-device formed layer L2 provided on the supporting substrate 11.

A method of providing a black matrix on a counter substrate side has been proposed to obtain a high-contrast display image. However, in this method, precise alignment is necessary when a supporting substrate on which an organic light-emission device is formed is laminated on a counter substrate. In the display 2, it possible to achieve a high-definition high-contrast display image by adopting the black layer 29B, without performing such alignment. In particular, when the counter substrate 18 is configured using a flexible substrate such as plastic, it is difficult to perform alignment work in terms of dimensional stability, surface smoothness, and handleability (handling ability) and therefore, contrast may be preferably increased by providing the black layer 29B in place of the black matrix.

For the black pigment included in the black layer 29B, for example, at least one kind of the following organic pigments and inorganic pigments may be used. Examples of the organic pigments may include azo-lake-based, insoluble-azo-based, condensed-azo-based, phthalocyanine-based, quinacridone-based, dioxazine-based, isoindolinone-based, anthraquinone-based, perinone-based, thioindigo-based, and perylene-based pigments. Examples of the inorganic pigments may include carbon black, titanium oxide, Milori blue, cobalt purple, manganese purple, ultramarine blue, Berlin blue, cobalt blue, cerulean blue, and viridian. These pigments may each be used alone, or a mixture of two or more kinds thereof may be used. Further, examples of the black dye may include nigrosine that is an azine-based compound condensed with aniline nitrobenzene (e.g., NUBIAN BLACK (registered trademark) series produced by Orient Chemical Industries Co., Ltd.) and BONJET BLACK (registered trademark) (produced by Orient Chemical Industries Co., Ltd.). The low-refractive-index layer 29A and the black layer 29B may each be preferably formed using a photosensitive resin material capable of being molded by light patterning, reflow, or the like, to simplify a formation process and to enable molding into a desirable shape.

As for this display 2, first, after the pixel-driving-circuit formed layer L1 and the first electrode 14 are formed on the supporting substrate 11 in a manner similar to that of the display 1 (FIG. 8A), the insulating layer 29 is formed as illustrated in FIG. 8B. The insulating layer 29 may be formed by depositing the material of the low-refractive-index layer 29A and the material of the black layer 29B in this order on the entire surface of the substrate 11 (on the first electrode 14 and a gate insulating layer 13) by spin coating, for example, and patterning the deposited materials. Here, when, for example, a positive-type black resist including a black pigment is used for the black layer 29B, the opening 29M may be formed by depositing this on the entire surface of the substrate 11, and then performing firing (for example, at 100° C. for about two minutes), selective exposure (150 mJ/cm$^2$), and development in this order. After the development is performed, this is heated to about 150° C. and maintained so that an organic solvent included in the black resist is removed. In this process, drying may be performed effectively by performing heating in a vacuum oven, for example. In this way, even if the insulating layer 29 has the laminated structure including the low-refractive-index layer 29A and the black layer 29B, it is possible to form the insulating layer 29 by a one-time lithography process similar to that of the insulating layer 19.

After the insulating layer 29 is formed, the organic layer 15, the second electrode 16, and the sealing layer 17 are formed in a manner similar to that of the display 1. As a result, the pixel-driving-circuit formed layer L1 and the light-emission-device formed layer L2 are formed on the supporting substrate 11. Finally, the display 2 is completed by adhering the counter substrate 18 and the supporting substrate 11 provided with the pixel-driving-circuit formed layer L1 and the light-emission-device formed layer L2 to each other. In such a display 2, a black matrix usually used is unnecessary and therefore, it is possible to reduce cost by suppressing the number of manufacturing processes.

When the material of the light emitting layer 15C is common to the organic light-emission devices 10R, 10G, and 10B, lights of the same color (for example, white) are emitted from the organic light-emission devices 10R, 10G, and 10B. Here, by providing the organic light-emission devices 10R, 10G, and 10B with color filters of different colors respectively, lights of different colors are extracted from the respective pixels. In the display 2, it is possible to provide such color filters in the light-emission-device formed layer L2. Specifically, after the second electrode 16 is formed, a protective layer made of, for example, $SiN_X$, $SiO_X$, or AlO may be formed on the entire surface on the second electrode 16, by a vacuum process such as sputtering and CVD (Chemical Vapor Deposition). The protective layer may be configured by laminating the above-described inorganic films, or may be laminated with an organic film. After the color filters are formed on this protective layer to correspond to the respective organic light-emission devices 10R, 10G, and 10B, the sealing layer 17 is formed. In other words, it is not necessary to form a color filter on the counter substrate 18 and therefore, it is possible to adhere the counter substrate 18 to the supporting substrate 11, without performing precise alignment work.

[Modification]

FIG. 9 illustrates a cross-sectional configuration of a main part of a display (a display 2A) according to a modification of the second embodiment. In this display 2A, a wall surface of an opening 39M of an insulating layer 39 is covered by a low-refractive-index layer 39A. Except this point, the display 2A has a configuration similar to that of the display 2, and functions as well as effects thereof are similar as well.

The insulating layer 39 includes a black layer 39B and the low-refractive-index layer 39A in this order from the first electrode 14 side, and the wall surface of the opening 39M is covered by the low-refractive-index layer 39A. This allows the display 2A to improve light extraction efficiency, as compared with the display 2.

In this display 2A, in a manner similar to those of the displays 1 and 2, after the pixel-driving-circuit formed layer L1 and the first electrode 14 are formed on the supporting substrate 11 (FIG. 10A), the insulating layer 39 is formed as illustrated in FIG. 10B. The insulating layer 39 is formed as follows. First, a material of the black layer 39B is applied to the entire surface of the substrate 11 (on the first electrode 14 and the gate insulating layer 13), and then patterned to form the black layer 39B. Subsequently, the low-refractive-index layer 39A is formed to cover this black layer 39B.

MODULE AND APPLICATION EXAMPLES

Application examples of the displays of the above-described embodiments and modification will be described below. The displays 1, 2, and 2A of the above-described embodiments and the like are applicable to electronic apparatuses in all fields, which display externally-inputted image signals or internally-generated image signals as still or moving images. The electronic apparatuses may include, for example, television apparatuses, digital cameras, laptop personal computers, mobile terminals such as mobile phones and smartphones, and video cameras.

(Module)

The display according to any of the above-described embodiments and the like may be incorporated, for example, as a module illustrated in FIG. 11, into any of various kinds of electronic apparatuses such as Application examples 1 to 5 that will be described later. In this module, for example, a region 210 exposed from the sealing layer 17 and the counter substrate 18 may be provided at one side of the supporting substrate 11, and an external connection terminal (not illustrated) may be formed in this exposed region 210, by extending wiring of the signal-line driving circuit 120 and the scanning-line driving circuit 130. The external connection terminal may be provided with a flexible printed circuit (FPC) 220 for input and output of signals.

Application Example 1

FIG. 12 illustrates an appearance of a television apparatus to which the display of any of the above-described embodiments and the like is applied. This television apparatus may include, for example, an image-display screen section 300 including a front panel 310 and a filter glass 320. The image-display screen section 300 is configured using the display according to any of the above-described embodiments.

Application Example 2

FIGS. 13A and 13B each illustrate an appearance of a digital camera to which the display of any of the above-described embodiments and the like is applied. This digital camera may include, for example, a flash emitting section 410, a display section 420, a menu switch 430, and a shutter button 440. The display section 420 is configured using the display according to any of the above-described embodiments.

Application Example 3

FIG. 14 illustrates an appearance of a laptop computer to which the display of any of the above-described embodiments and the like is applied. This laptop computer may include, for example, a main body section 510, a keyboard 520 provided to enter characters and the like, and a display section 530 displaying an image. The display section 530 is configured using the display according to any of the above-described embodiments.

Application Example 4

FIG. 15 illustrates an appearance of a video camera to which the display of any of the above-described embodiments and the like is applied. This video camera may include, for example, a main body section 610, a lens 620 disposed on a front face of the main body section 610 to shoot an image of a subject, a start/stop switch 630 used in shooting, and a display section 640. The display section 640 is configured using the display according to any of the above-described embodiments.

Application Example 5

FIGS. 16A, 16B, 16C, 16D, 16E, 16F, and 16G each illustrate an appearance of a mobile phone to which the display of any of the above-described embodiments and the like is applied. This mobile phone may be, for example, a unit in which an upper housing 710 and a lower housing 720 are connected by a coupling section (a hinge section) 730, and include a display 740, a sub-display 750, a picture light 760, and a camera 770. The display 740 or the sub-display 750 is configured using the display according to any of the above-described embodiments.

The present technology has been described above with reference to some embodiments and modification, but the present technology is not limited thereto and may be variously modified. For example, in the above-described embodiments, the display using the top-emission-type organic light-emission device has been described. However, the present technology is also applicable to a bottom-emission-type organic display having a light extraction direction to the first electrode 14 side (the supporting substrate 11 side).

Further, for example, in the above-described embodiments, the display in which the drive system is an active matrix system has been described, but a display of a passive matrix system may be adopted.

Furthermore, in the above-described embodiments, the display using the organic light-emission device has been taken as an example. However, the present technology may be applied to, for example, a display using other light-emission device such as an inorganic light-emission device.

In addition, in the above-described embodiments and the like, the case in which, of the organic layer 15, the lowermost layer on the first electrode 14 side is the hole injection layer 15A has been taken as an example. However, the lowermost layer on the first electrode 14 side, namely, a layer in contact with the insulating layer 19, may be a layer other than the hole injection layer 15A.

Still furthermore, in the above-described embodiments and the like, the insulating layers 19, 29, and 39 in a tapered shape have been taken as examples, but the insulating layers 19, 29, and 39 may be in other shape.

Moreover, for example, the materials and thicknesses, or the film formation methods and film formation conditions of the respective layers described in each of the embodiments are illustrative and not limitative. Other materials and thicknesses, or other film formation methods and film formation conditions may be adopted.

It is to be noted that the present technology may adopt the following configurations.

(1) A display including:

an insulating layer having an opening; and a light-emission device including a functional layer and provided in the opening of the insulating layer, the functional layer being provided between a first electrode and a second electrode, and including a light emitting layer, wherein the insulating layer includes a low-refractive-index layer, the low-refractive-index layer being made of a material having a lower refractive index than a refractive index of a layer, and the layer being in proximity to the insulating layer and included in the functional layer.

(2) The display according to (1), wherein the low-refractive-index layer and the functional layer are in contact with each other.

(3) The display according to (1) or (2), wherein a wall surface of the opening of the insulating layer is inclined (at an inclination θ) with respect to a surface of the first electrode.
(4) The display according to (3), wherein
the inclination θ is an acute angle, and
a light extraction direction is pointed to the second electrode side.
(5) The display according to any one of (1) to (4), wherein the first electrode and the functional layer are in contact with each other in the opening of the insulating layer.
(6) The display according to any one of (1) to (5), wherein the insulating layer includes, besides the low-refractive-index layer, a black layer containing black pigment, dye, or coloring matter.
(7) The display according to (6), wherein the insulating layer includes the low-refractive-index layer and the black layer in this order from the first electrode side.
(8) The display according to (6), wherein a wall surface of the opening is covered by the low-refractive-index layer.
(9) The display according to any one of (6) to (8), wherein the black layer is made of a photosensitive resin in which the black pigment, dye, and coloring matter are dispersed.
(10) The display according to any one of (1) to (9), wherein
the light-emission device is provided between a first substrate on the first electrode side and a second substrate on the second electrode side, and
the second substrate is made of a flexible material.
(11) The display according to any one of (1) to (10), wherein the functional layer is configured using an organic material.
(12) An electronic apparatus provided with a display, the display including:
an insulating layer having an opening; and
a light-emission device including a functional layer and provided in the opening of the insulating layer, the functional layer being provided between a first electrode and a second electrode and including a light emitting layer,
wherein the insulating layer includes a low-refractive-index layer, the low-refractive-index layer being made of a material having a lower refractive index than a refractive index of a layer, and the layer being in proximity to the insulating layer and included in the functional layer.

The present application is based on and claims priority from Japanese Patent Application No. 2011-269987 filed in the Japan Patent Office on Dec. 9, 2011, the entire contents of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A display comprising:
a substrate;
a transistor layer with one or more transistors on the substrate;
a first electrode overlying the transistor layer;
a flattening layer between the transistor layer and the first electrode;
an insulating layer having an opening with an inclined side surface, the opening overlying the first electrode and the one or more transistors;
a light-emission device associated with the opening, the light-emission device including a functional layer in and outside of the opening and overlying the inclined side surface and edge of one end of the opening; and
a second electrode, the functional layer being between the first electrode and the second electrode,
wherein,
the functional layer is comprised of two or more layers all of which are in and outside of the opening and overlying the inclined side surface of the opening,
the insulating layer includes a low-refractive-index layer and a black layer in this order proceeding away from the flattening layer, the low-refractive-index layer is made of material having a refractive index lower than a refractive index of another layer and the black layer contains at least one of black pigment, dye, or coloring matter,
of the layers of the functional layer, the another layer is most proximate to the insulating layer and in contact with the first electrode, and
the first electrode is reflective and the second electrode is transparent such that light from the functional layer is reflected by the first electrode and emitted through the second electrode.
2. The display according to claim 1, wherein insulating layer is in direct contact with the flattening layer.
3. The display according to claim 1, wherein a wall surface of the opening of the insulating layer is inclined at an inclination of θ with respect to a surface of the first electrode.
4. The display according to claim 3, wherein the inclination of θ is an acute angle.
5. The display according to claim 1, wherein the first electrode and the functional layer are in contact with each other in the opening of the insulating layer.
6. The display according to claim 1, wherein the black layer is made of a photosensitive resin in which the black pigment, dye, or coloring matter is dispersed.
7. The display according to claim 1, further comprising:
a first substrate on a side of the first electrode and a second substrate on a side of the second electrode,
wherein,
the light-emission device is between the first and second substrates, and
the substrate is made of a flexible material.
8. The display according to claim 1, wherein the functional layer is configured of an organic material.
9. An electronic apparatus provided with a display according to claim 1.
10. The display of claim 1, wherein: one of the transistors is connected to first electrode to drive the light emission device, the other of the transistors is connected to drive the one transistor, and the first electrode overlies both transistors.
11. The electronic apparatus of claim 9, wherein: one of the transistors is connected to first electrode to drive the light emission device, the other of the transistors is connected to drive the one transistor, and the first electrode overlies both transistors.
12. A display comprising:
a substrate;
a transistor layer with two transistors on the substrate;
a first electrode overlying the transistor layer;
a flattening layer between the transistor layer and the first electrode;
an insulating layer having an opening with an inclined side surface, the opening overlying the first electrode and the two transistors, the first electrode and a second electrode overlapping opposite ends of the opening; and a light-emission device associated with the opening, the light-emission device including a functional layer in and outside of the opening and overlying the inclined side surface and an edge of one of the ends of the opening, the functional layer including at least two layers including a light emitting layer and a hole injection layer, wherein, all layers of the functional layer are in and outside of the opening and overlying the inclined side surface of the opening, the insulating layer includes a low-refractive-index layer and a black layer in this order proceeding away from the flattening layer, the low-refractive-index layer comprises a low-refractive-index material having a refractive index lower than a refractive index of the hole injection layer and the black layer contains at least one of black pigment, dye, or coloring matter, of the layers of the functional layer, the hole injection layer is most proximate the insulating layer and in contact with the first electrode, the first electrode is reflective and the second electrode is transparent such that light from the functional layer is reflected by the first electrode and emitted through the second electrode, one of the transistors is connected to first electrode to drive the light emission device, the other of the transistors is connected to drive the one transistor, and the first electrode overlies both transistors.

* * * * *